United States Patent
Wilson

(10) Patent No.: US 11,350,525 B2
(45) Date of Patent: May 31, 2022

(54) METHOD AND APPARATUS FOR MOUNTING A DUT ON A TEST BOARD WITHOUT USE OF SOCKET OR SOLDER

(71) Applicant: Nuvoton Technology Corporation, Hsinchu (TW)

(72) Inventor: Simon Wilson, San Jose, CA (US)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 200 days.

(21) Appl. No.: 16/877,405

(22) Filed: May 18, 2020

(65) Prior Publication Data
US 2021/0360787 A1  Nov. 18, 2021

(51) Int. Cl.
| | | |
|---|---|---|
| G01R 31/28 | (2006.01) |
| G11C 29/06 | (2006.01) |
| G11C 29/50 | (2006.01) |
| G11C 29/56 | (2006.01) |
| H01R 12/00 | (2006.01) |
| H01L 21/70 | (2006.01) |
| H01L 23/544 | (2006.01) |
| H05K 1/11 | (2006.01) |
| H05K 7/14 | (2006.01) |
| H05K 1/02 | (2006.01) |
| H05K 7/10 | (2006.01) |
| H05K 3/34 | (2006.01) |
| H01L 23/00 | (2006.01) |

(52) U.S. Cl.
CPC ............. *H05K 1/111* (2013.01); *H01L 24/05* (2013.01); *H05K 1/023* (2013.01); *H05K 3/3494* (2013.01); *H05K 7/1092* (2013.01); *H05K 7/1407* (2013.01); *H01L 2224/05144* (2013.01)

(58) Field of Classification Search
CPC ............... G01R 31/28; G01R 31/2817; G01R 31/2862; G01R 31/2874; G11C 29/06; G11C 29/50; G11C 29/56; G11C 29/56016; H01R 12/00; H01R 12/523; H01L 21/70; H01L 23/544; H01L 23/565; H01L 23/3128; H01L 25/50
USPC ............................ 361/767; 439/65; 257/126
See application file for complete search history.

(56) References Cited

U.S. PATENT DOCUMENTS

| | | | |
|---|---|---|---|
| 5,528,462 A * | 6/1996 | Pendse | H01L 23/4006 361/767 |
| 6,975,518 B2 | 12/2005 | Frutschy et al. | |
| 2004/0000428 A1 | 1/2004 | Lii et al. | |
| 2004/0016939 A1* | 1/2004 | Akiba | H01L 23/544 257/E21.705 |
| 2005/0085034 A1* | 4/2005 | Akiba | H01L 21/565 257/E21.705 |

(Continued)

*Primary Examiner* — Xiaoliang Chen
(74) *Attorney, Agent, or Firm* — Kilpatrick Townsend & Stockton LLP

(57) ABSTRACT

A method is provided for mounting a semiconductor IC to a substrate without a socket or solder. The method includes disposing a guide structure on the substrate. The substrate has multiple contact pads disposed thereon. The substrate also has multiple nuts formed therein for connecting to one or more bolts. The method also includes placing the semiconductor IC inside the guide structure such that the semiconductor IC makes contact with the contact pads. A top plate is disposed on the semiconductor IC. Further, the top plate and the semiconductor IC are fastened to the substrate.

6 Claims, 10 Drawing Sheets

(56) References Cited

U.S. PATENT DOCUMENTS

| | | | |
|---|---|---|---|
| 2010/0297857 A1* | 11/2010 | Ito | H01R 12/523 |
| | | | 439/65 |
| 2021/0132140 A1* | 5/2021 | Tsai | G11C 29/06 |
| 2021/0132142 A1* | 5/2021 | Tsai | G01R 31/2874 |

* cited by examiner

METHOD AND APPARATUS FOR MOUNTING A DUT ON A TEST BOARD WITHOUT USE OF SOCKET OR SOLDER

BACKGROUND OF THE INVENTION

This invention relates to the field of electronic circuits. More particularly, the present invention relates to efficient testing of semiconductor devices. Some embodiments of the invention relate to a method and apparatus of mounting a semiconductor integrated circuit (IC) device on a test board for the purpose of device test, debug, or characterization.

The conventional method for mounting a semiconductor integrated circuit (IC) device on a test board for the purpose of device test, debug, or characterization often involve soldering and de-soldering. The inventor has observed many drawbacks associated with the soldering and de-soldering process. For example, soldering can be time-consuming. Further, packages without leads are often difficult to solder and de-solder by hand from test boards. The process of soldering and de-soldering can also damage the semiconductor IC and the solder pads of test boards, thereby decreasing the life of a test board. Infra-red (IR) reflow is an available technique for soldering ICs to test boards. However, IR reflow is usually used for mass production and the application of all components to the test board. Therefore, IR reflow is not suited for soldering and de-soldering only a device under test (DUT), when the test board has other supporting components already installed on the test board.

Therefore, an improved method for mounting a semiconductor IC on a test board is desirable.

BRIEF SUMMARY OF THE INVENTION

Some embodiments address the issues associated with the process of soldering and de-soldering a semiconductor IC device to a test board by presenting a method and apparatus for connecting a DUT to a substrate without soldering or socket. Some embodiments provide a method for mounting a DUT without use of socket or solder. For example, in some embodiments, printed circuit board (PCB) fabrication processes are used to create an electrical contact to the DUT, provide placement guide for the DUT and hold the DUT in place. In addition, standard mechanical hardware, such as bolts, washers, etc., can be used to hold the DUT in place.

Many benefits can be achieved by embodiments of the present invention over conventional techniques. For example, embodiments of the invention provide a simple and cost effective method and apparatus for mounting a semiconductor IC on a test board without causing damages to the IC or the test board. The apparatus can be made using conventional PCB manufacturing material, components, and conventional processes. There is no need for special materials or equipment. Embodiments of the invention can be advantageously applied to leadless type IC packages, quad-flat no-leads (QFN), etc. However, it is understood that embodiments of the invention can also be applied to other lead type IC packages.

According to some embodiments of the present invention, a test board for testing a semiconductor integrated circuit (IC) includes a printed circuit board (PCB), four self-clinching nuts disposed in the PCB, and multiple solder pads disposed on the PCB for coupling to the semiconductor IC. A gold layer is disposed on each of the multiple solder pads. Further, a guide structure of an insulating material is disposed on the PCB. A center opening of the guide structure exposes the multiple solder pads, and the center opening of the guide structure is sized for placement of the semiconductor IC to make contact with the solder pads. Moreover, there are four bolt holes in the guide structure. Each of the four bolt holes is aligned to a respective corresponding one of the four self-clinching nuts in the PCB. The test board also has a top plate having four bolt holes formed therein. The four bolt holes in the top plate match the four bolt holes in the guide structure for fastening the semiconductor IC to the PCB using one or more bolts and the four self-clinching nuts.

In some embodiments, the above test board is configured for mounting the semiconductor IC in a leadless package.

In some embodiments, the top plate includes a blank proto-type board.

In some embodiments, the guide structure is a contiguous structure surrounding the center opening.

In some embodiments, the guide structure includes a glass-reinforced epoxy laminate.

In some embodiments, the test board can also have one or more of connectors for connecting to a testing equipment, conductive lines connecting the connector to the contact pads, and circuit elements for conditioning signals to and from the testing equipment, the circuit elements including one or more of capacitors, inductors, resistors, diodes, and other supporting semiconductor ICs.

According to some embodiments of the present invention, a test board for mounting a semiconductor integrated circuit (IC) includes a substrate, one or more nuts disposed in the substrate, multiple contact pads disposed on the substrate for coupling to the semiconductor IC, and a conductive layer formed on each of the multiple contact pads. A guide structure is disposed on the substrate, with a center opening of the guide structure exposing the multiple contact pads. The center opening of the guide structure is sized for placement of the semiconductor IC to make contact with the contact pads. Further, one or more bolt holes are formed in the guide structure, and each of the one or more bolt holes is aligned to a respective corresponding one of the one or more nuts in the substrate. Moreover, the test board also includes a top plate having one or more bolt holes formed therein. The one or more bolt holes in the top plate match the one or more bolt holes in the guide structure for fastening the semiconductor IC to the substrate using one or more bolts and the one or more nuts in the substrate.

In some embodiments, the substrate includes printed circuit board (PCB).

In some embodiments, the nuts are self-clinching nuts.

In some embodiments, the conductive layer is characterized by a higher conductivity than the contact pads.

In some embodiments, the contact pads are copper contact pads, and the conductive layer comprises gold.

In some embodiments, the test board can also include one or more of connectors for connecting to the testing equipment, conductive lines connecting the connector to the contact pads, and circuit elements for conditioning signals to and from the testing equipment.

In some embodiments, the guide structure is made of an insulator material.

In some embodiments, the guide structure is made of a glass-reinforced epoxy laminate.

According to some embodiments of the present invention, a method for mounting a semiconductor IC to a substrate without a socket or solder includes disposing a guide structure on the substrate, which has multiple contact pads disposed thereon. The substrate also has multiple nuts formed therein for connecting to one or more bolts. The method includes placing the semiconductor IC inside the guide structure such that the semiconductor IC makes contact with the contact pads. A top plate is disposed on the semiconductor IC. Further, the top plate and the semiconductor IC are fastened to the substrate.

In some embodiments, the substrate includes a printed circuit board (PCB).

In some embodiments, the method also includes connecting supporting components for a test board to the substrate before disposing the guide structure on the substrate. The supporting components can include one or more of connectors for connecting to a testing equipment, conductive lines connecting the connector to the contact pads, and circuit elements for conditioning signals to and from the testing equipment.

In some embodiments, the method also includes connecting supporting components by hand-solder or infra-red (IR) reflow.

In some embodiments, the guide structure disposed on the substrate comprises using one or more bolts to fasten the guide structure to a first subset of nuts in the substrate.

In some embodiments, the top plate and the semiconductor IC are fastened to the substrate using one or more bolts to fasten the top plate to a second subset of nuts in the substrate.

Various additional features and advantages of the present invention can be more fully appreciated with reference to the detailed description and accompanying drawings that follow.

DETAILED DESCRIPTION OF THE INVENTION

In some embodiments, a method for mounting a semiconductor IC to a printed circuit board (PCB) without the use of socket or solder is provided. The method uses basic PCB fabrication methods and mechanical hardware. Some embodiments include the use of an extra gold layer on the usual copper conductor used in fabrication and the isolation layer to aid IC placement and clamping to the PCB. Mechanical hardware being integrated nuts and bolts to hold the IC in place.

In some embodiments, a PCB schematic is designed as normal. Additional processes are required during layout design and fabrication. In design, a larger margin than usual around the IC package footprint is created to accommodate the placement of self-clinching nuts and placement guide. In process, standard copper solder pads are laid out for the IC. In addition, an extra layer of gold is placed on top of the copper solder pads. The self-clinching nuts are placed at the four corners of the IC package footprint. The placement guide is manufactured from the PCB interlayer insulator. In some examples, the guide thickness is approximately 60% that of the target IC. Bolt holes can be placed at the four corners of the guide to align with the self-clinching nuts in the PCB itself. Finally, the guide has a cutout to match the package outline dimensions of the target IC. A piece of blank prototype-board (preferably perforated) is cut to size and holes drilled at the corners to align with the nuts mentioned previously.

In some embodiments, once the PCB is fabricated and the supporting components are placed by hand-solder or IR reflow, the semiconductor IC can be placed on the PCB with the following flow:

1. Place the DUT upon the gold pads of the IC package footprint;
2. Align the DUT using the FR4 (fire retardant grade 4) material guide plate;
3. Clamp guide plate into place at two diagonally opposite bolt holes;
4. Place prototype-board top plate over the DUT; and
5. Clamp the prototype-board in place at the other two diagonally opposite bolt holes.

As used herein, the bolt and nut refer to the pair of components in a fastening device. The bolt usually has a head and a cylindrical body with screw threads along a portion of its length. The nut is the female member of the pair, having internal threads to match those of the bolt.

Additional embodiments and examples are described below with reference to FIGS. 1-10.

Figure 1:
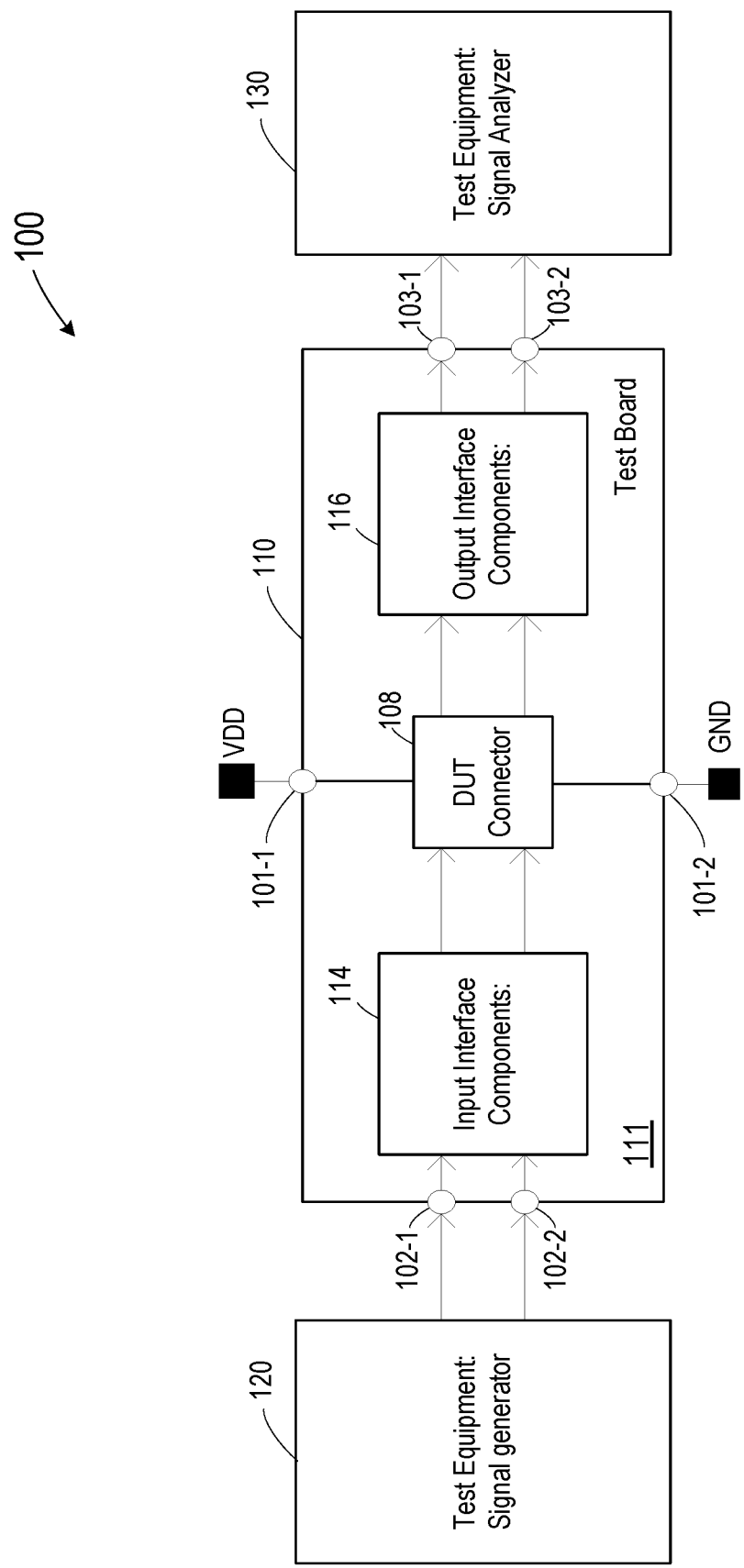
FIG. 1 is a simplified block diagram of a test system according to some embodiments of the present invention.

FIG. 1 is a simplified block diagram of a test system according to some embodiments of the present invention. As shown in FIG. 1, a semiconductor test system 100 includes a test board 110, a test signal generator 120, and a signal analyzer 130. Test signal generator 120 can be part of a test equipment or a stand-alone signal generator. Similarly, signal analyzer 130 can be part of a test equipment or a stand-alone signal generator.

Test board 110 has a substrate 111 and two power terminals 101-1 and 101-2 for connecting to a power supply VDD and a ground terminal GND, respectively. Test board 110 also has input terminals 102-1, 102-2, . . . , etc. for connecting to the test signal generator 120 for receiving test signals for testing a device-under-test (DUT). Test board 110 also has output terminals 103-1, 103-2, . . . , etc., for connecting to the signal analyzer 130 to transfer test results to the signal analyzer for analysis.

Test board 110 has a connector 108 for connecting to a device-under-test (DUT). Test board 110 also has input interface components 114 and output interface components 116. For analog testing, input interface components 114 and output interface components 116 can include signal conditioning circuits such as filters, and can include capacitors, inductors, resistors, diodes, and other supporting semiconductor ICs. For digital and other more complicated testing, test board 110 can include signal processing circuits to handle tasks for the testing.

A portion of test board 110, including a DUT connector 108, is described in detail below with reference to FIGS. 2-10. Briefly, DUT connector 108 includes multiple contact pads disposed on the substrate for coupling to the DUT, and conductive interconnect lines for connecting the DUT to other components on the test board and, ultimately, to the test equipment. In some embodiments, a guide structure is disposed on the substrate. A center opening of the guide structure exposes the multiple contact pads for contacting the DUT.

Figure 2:
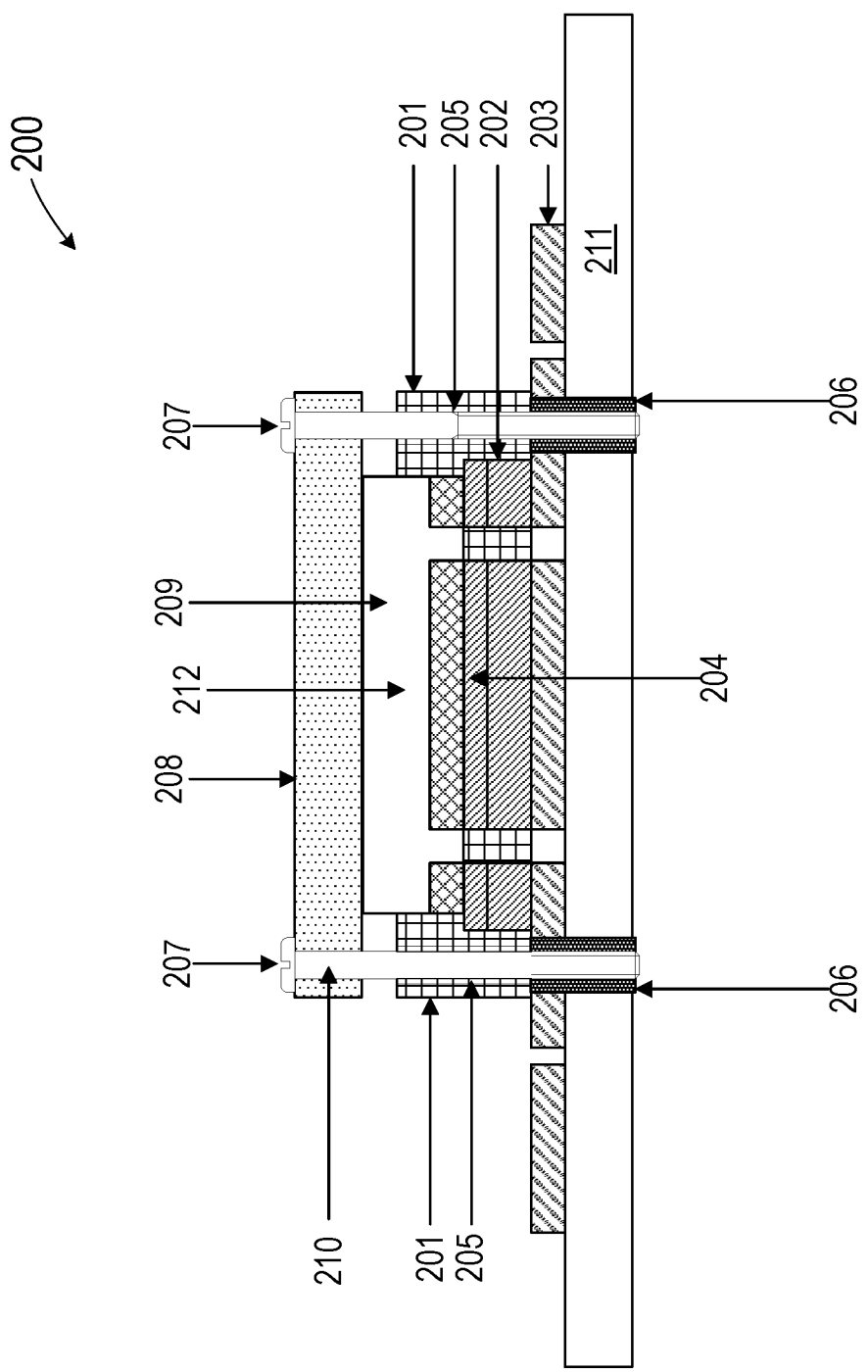
FIG. 2 is a cross-sectional diagram illustrating an apparatus that can be part of a test board according to some embodiments of the present invention.

FIG. 2 is a cross-sectional diagram illustrating an apparatus that can be part of a test board according to some embodiments of the present invention. As shown in FIG. 2, apparatus 200 is an exemplary device for mounting a semiconductor integrated circuit (IC) that can be part of test board 110 in FIG. 1. Apparatus 200 includes a substrate 211, one or more nuts 206 disposed in the substrate, multiple contact pads 202 disposed on metal interconnect lines 203 on the substrate 211 for coupling to a semiconductor IC 209. Apparatus 200 also includes a conductive layer 204 disposed on each of the multiple contact pads 202, a guide structure 201 disposed on the substrate. In packages such as QFN package type, an exposed pad is usually used as a GND/die substrate connection. However, not all IC packages have a GND/die substrate connection, so layer 204 would not be required. A center opening 212 of the guide structure 201 exposes the multiple contact pads 202. An example of a top view of the center opening 212 is shown in FIG. 4 as opening 312. The center opening 212 of the guide structure is sized for placement of the semiconductor IC 209 to make contact with the contact pads 202. One or more bolt holes 205 are formed in the guide structure 201. Each of the one or more bolt holes 205 is aligned to a respective corresponding one of the one or more nuts 206 in the substrate 211. A top plate 208, can have one or more bolt holes 210 formed in the top plate 208. The one or more bolt holes 210 in the top plate matches the one or more bolt holes 205 in the guide structure 201 for fastening the semiconductor IC 209 to the substrate 211 using one or more bolts 207 and the one or more nuts 206 in substrate 211. Further details are described below with reference to FIGS. 3-10.

Figure 3:
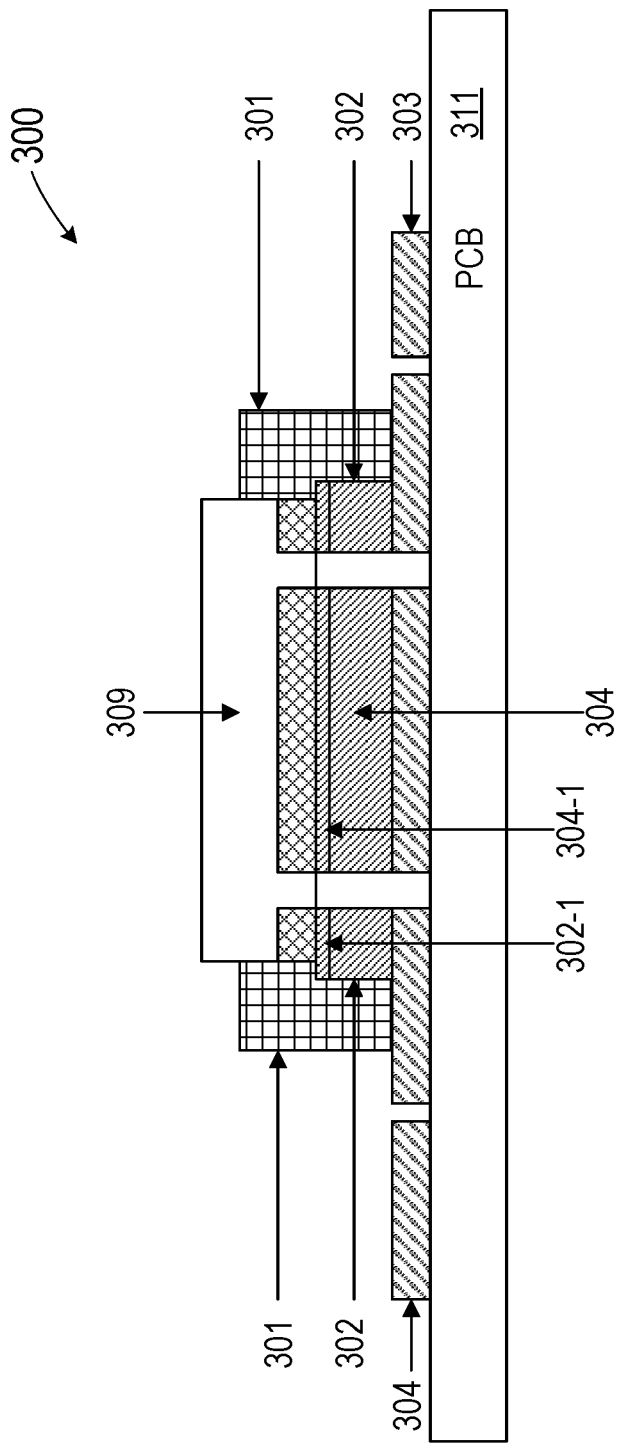
FIG. 3 is a cross-sectional diagram illustrating part of an apparatus that can be used as part of apparatus 200 of FIG. 2 according to some embodiments of the present invention.
Figure 4:
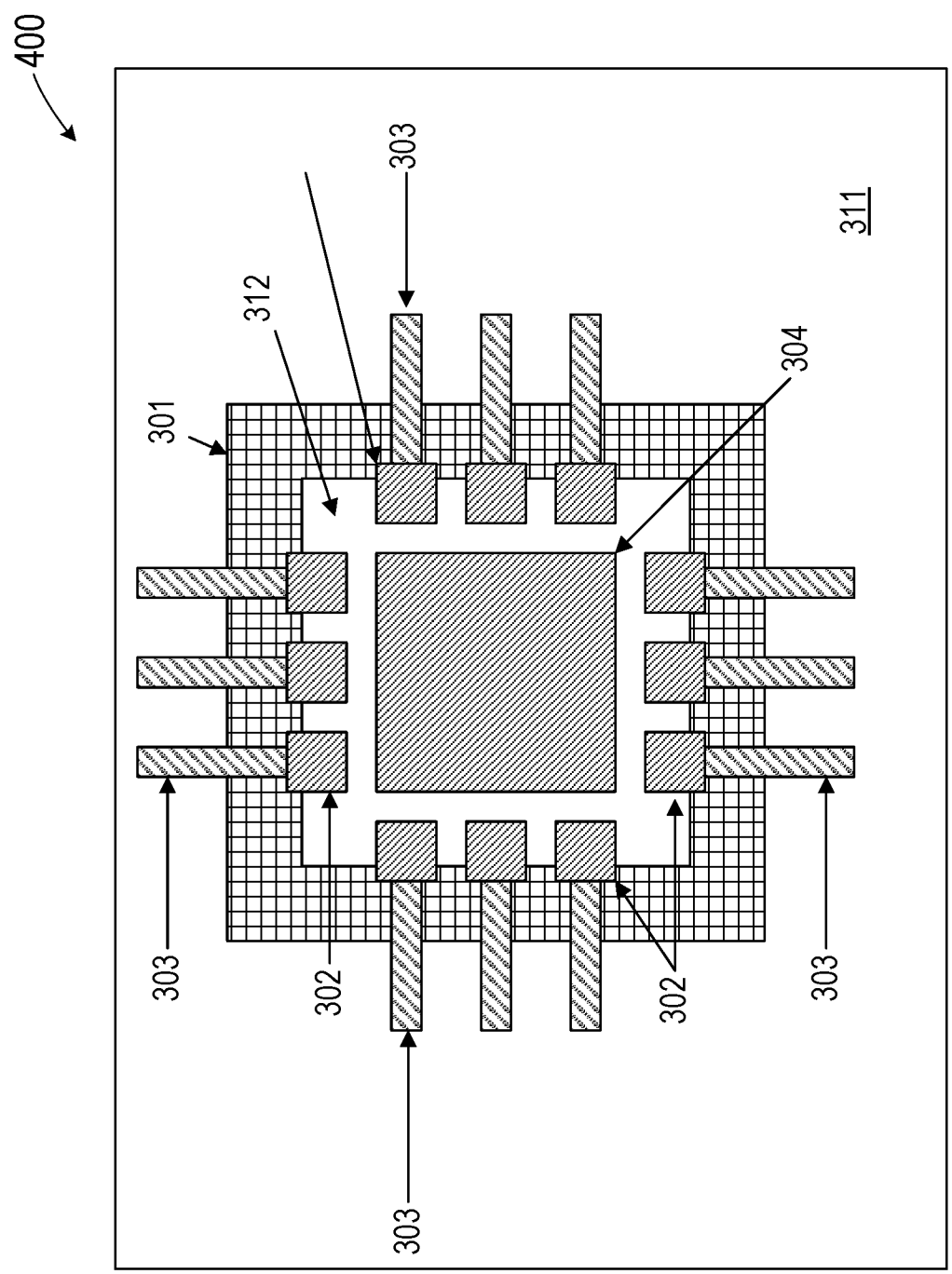
FIG. 4 is a top view diagram illustrating part of apparatus 300 of FIG. 3 according to some embodiments of the present invention.

FIG. 3 is a cross-sectional diagram illustrating part of an apparatus that can be used as part of apparatus 200 of FIG. 2 according to some embodiments of the present invention. As shown in FIG. 3, apparatus 300 includes a substrate 311, and multiple contact pads 302 and a center pad 304 are disposed on metal interconnect lines 303 on substrate 311 for coupling to a device under test (DUT) 309, which can be a semiconductor IC. Apparatus 300 also includes a conductive layer (shown as 302-1 and 304-1) disposed on each of the multiple contact pads 302 and the center pad 304. In some embodiments, substrate 311 can be a printed circuit board (PCB). Contact pads 302 can be solder pads, for example, the standard 1 oz. copper solder pads. Metal interconnect lines 303 can be metal conductive traces formed on the PCB for connecting to other components on the PCB, for example, those described in connection with FIG. 1. The conductive layer 304 can be formed on the contact pads to reduce contact resistance. Therefore, the conductive layer 304 has a higher electrical conductivity than the contact pads. As an example, conductive layer 304 can be a 10 µm gold layer for DUT pin contact. As an example, metal interconnect lines can also be made of the standard 1 oz. copper.

In FIG. 3, apparatus 300 also includes a guide structure 301 disposed on the substrate 311 for guiding DUT placement. A center opening 312 (not shown in FIG. 3, shown in FIG. 4) of the guide structure 301 exposes the multiple contact pads 302. In some embodiments, guide structure 301 is preferably made of an insulating material. As an example, a PCB interlayer insulator known as FR4 (fire retardant grade 4) material can be used to form the guide structure 311. In some embodiments, guide structure 301 has a thickness that is at least half of the thickness of the DUT package.

FIG. 4 is a top view diagram illustrating part of apparatus 300 of FIG. 3 according to some embodiments of the present invention. For example, FIG. 4 shows a substrate 311, and multiple contact pads 302 are disposed on metal interconnect lines 303 on substrate 311. Apparatus 300 also includes a conductive layer 304 disposed on each of the multiple contact pads 302. Further, a guide structure 301 is disposed on the substrate 311 for guiding DUT placement. A center opening 312 of the guide structure 301 exposes the multiple contact pads 302. In this example, guide structure 301 is shown as having a contiguous structure, and center opening 312 is surrounded by guide structure 301. However, other designs can also be used. For example, guide structure 301 can include multiple segments placed in position for guiding DUT placement.

Figure 5:
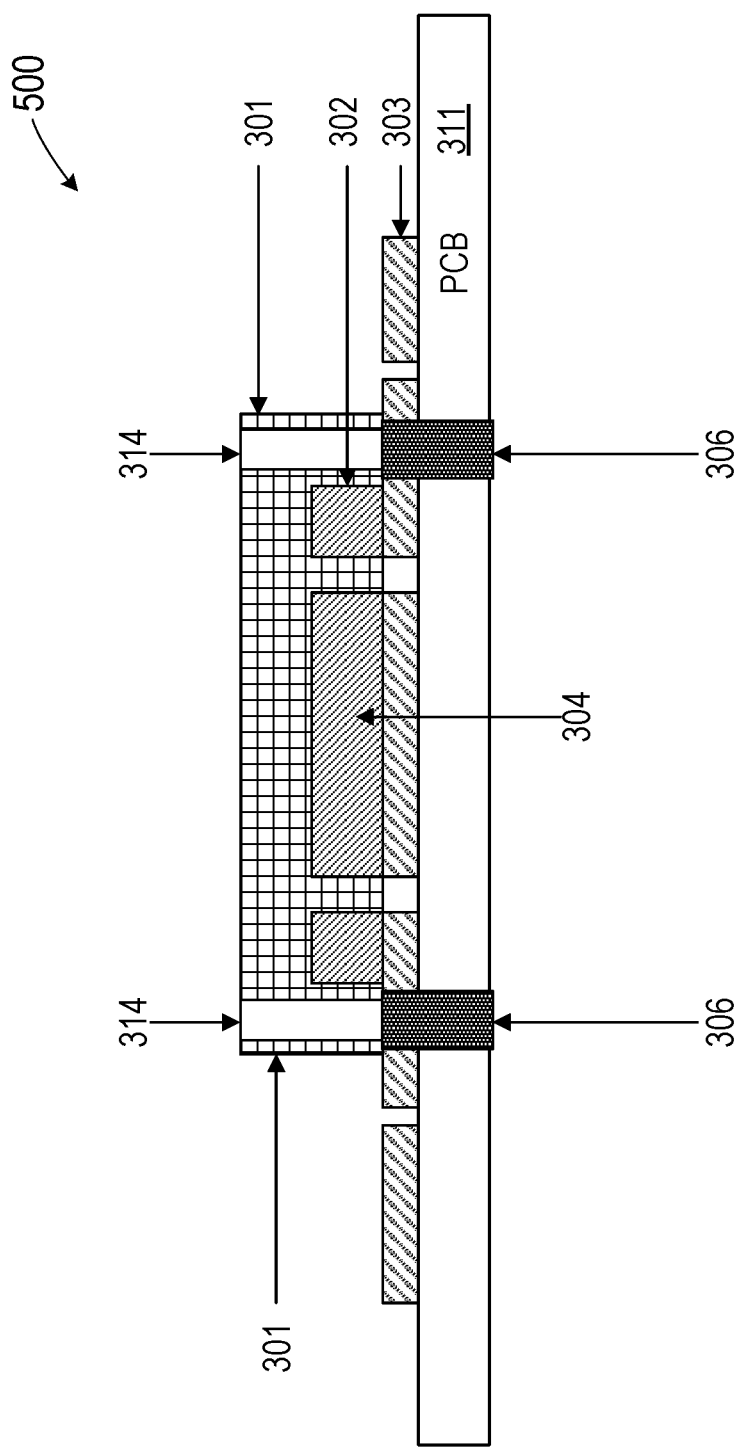
FIG. 5 is a cross-sectional view diagram illustrating part of apparatus 300 of FIG. 3 according to some embodiments of the present invention.

FIG. 5 is a cross-sectional view diagram illustrating part of apparatus 300 of FIG. 3 according to some embodiments of the present invention. FIG. 5 shows an apparatus 500 that includes the substrate 311, guide structure 301, contact pads 302, center pad 304, and metal interconnect lines 303 as described above in connection to FIG. 3. In addition, apparatus 500 also has one or more nuts 306 disposed in the substrate 311 and one or more bolt holes 314 in guide structure 301 that are aligned or matched to the nuts 306 in the substrate. In some embodiments, nuts 306 can be self-clinching nuts, and bolt holes 314 can be made in guide structure 301. For example, bolt holes 314 can be made by drilling or other suitable means.

Figure 6:
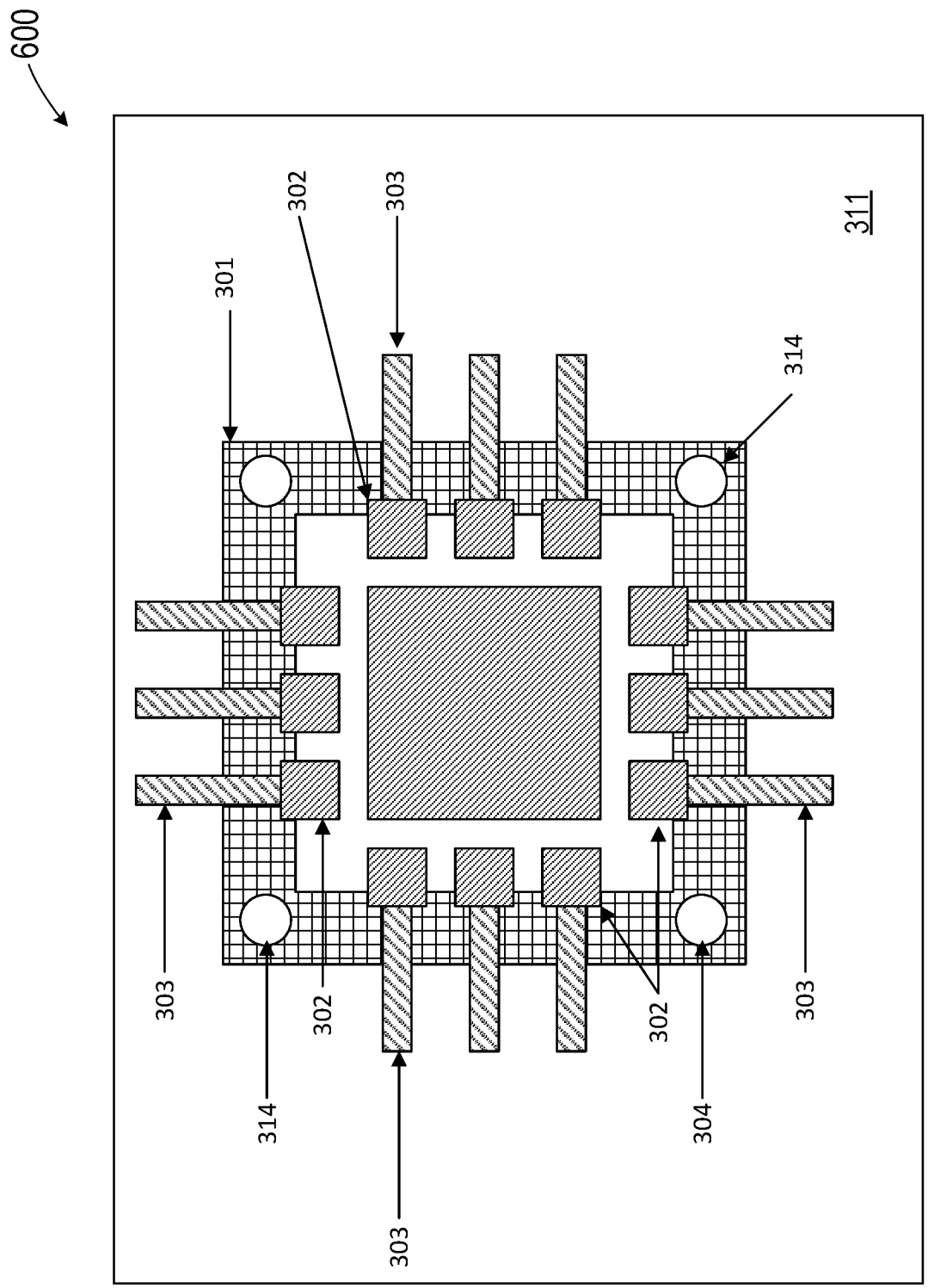
FIG. 6 is a top view diagram illustrating part of apparatus 300 of FIG. 5 according to some embodiments of the present invention.

FIG. 6 is a top view diagram illustrating part of apparatus 300 of FIG. 5 according to some embodiments of the present invention. For example, apparatus 600 in FIG. 6 shows similar components as described in connection to FIG. 4 and FIG. 5. In addition, FIG. 6 shows four bolt holes 314. A matching set of four nuts 306 are not visible in the top view diagram. In other embodiments, different numbers of nuts and bolt holes can also be used.

Figure 7:
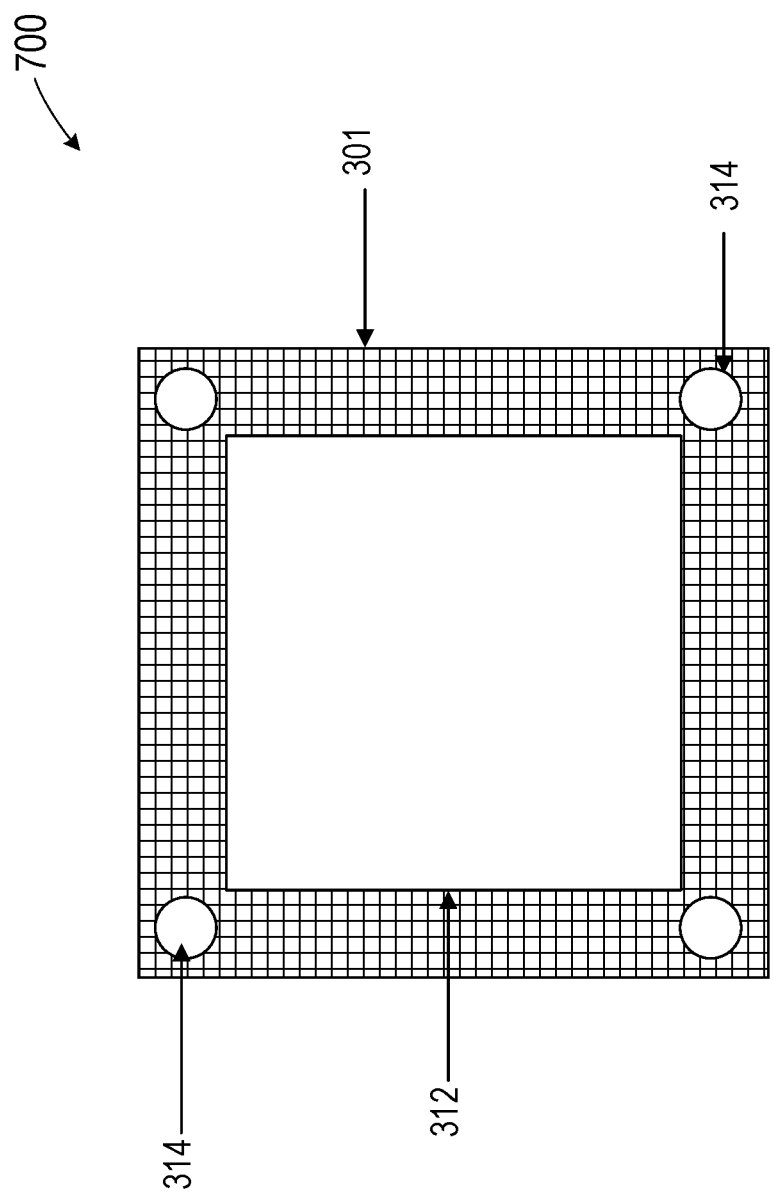
FIG. 7 is a top view diagram illustrating part of apparatus 500 of FIG. 5 according to some embodiments of the present invention.

FIG. 7 is a top view diagram illustrating part of apparatus 500 of FIG. 5 according to some embodiments of the present invention. For example, apparatus 700 in FIG. 7 shows a top view of guide structure 301, four bolt holes 314 formed in guide structure 301, and center opening 312 enclosed by guide structure 301. In some embodiments, the center opening 312 can be a cut-out removed from the insulator material of guide structure 301, to fit the package outline dimensions of the DUT.

Figure 8:
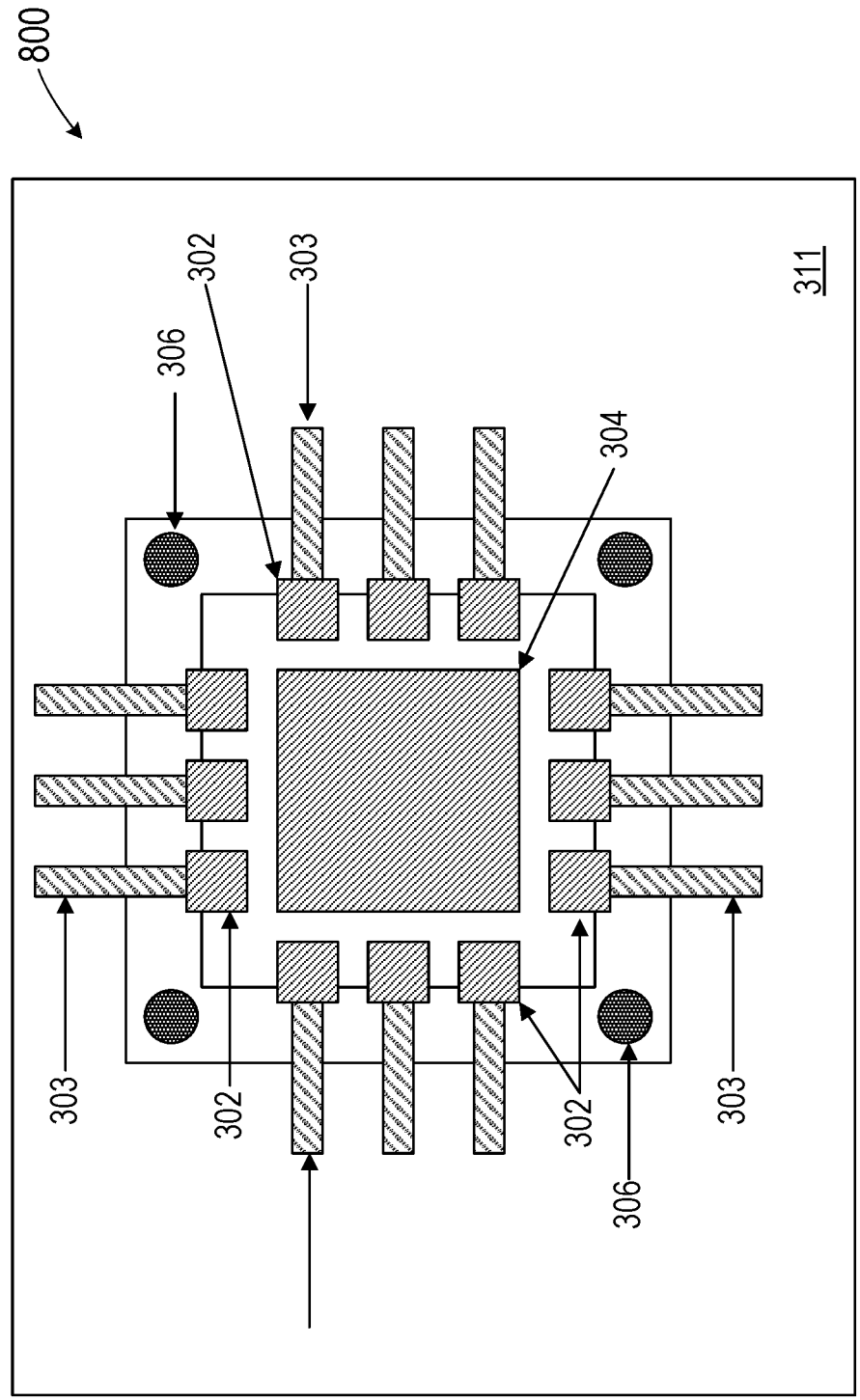
FIG. 8 is a top view diagram illustrating part of apparatus 500 of FIG. 5 according to some embodiments of the present invention.
Figure 9:
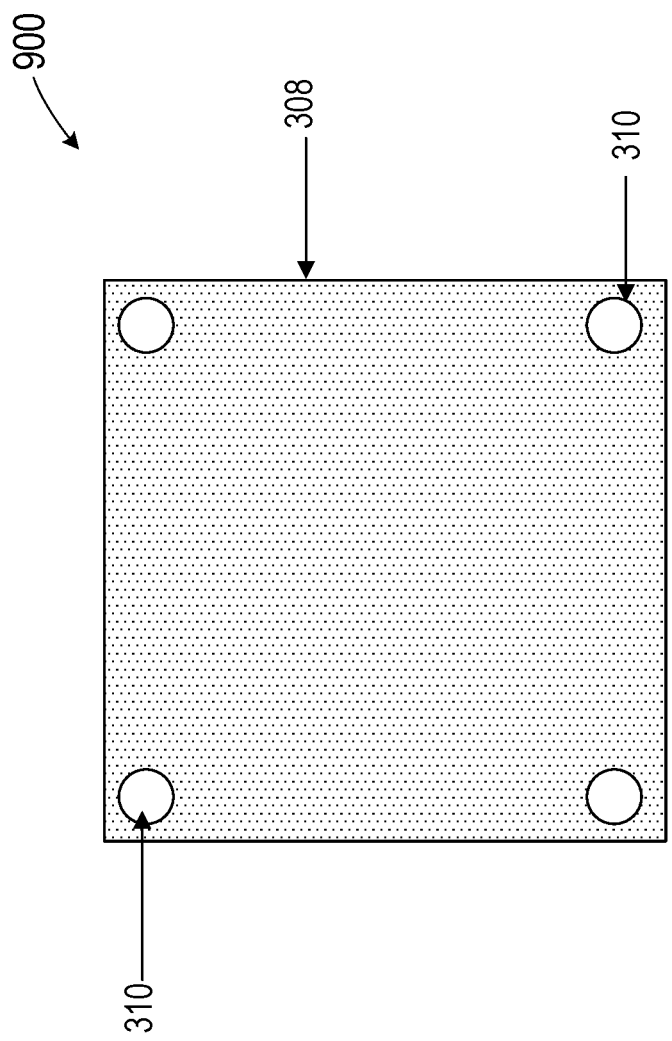
FIG. 9 is a top view diagram illustrating an apparatus that can be used as part of apparatus 200 of FIG. 2 according to some embodiments of the present invention.

FIG. 8 is a top view diagram illustrating part of apparatus 500 of FIG. 5 according to some embodiments of the present invention. Apparatus 800 in FIG. 8 shows a top view of apparatus 500 in FIG. 5 with the guide structure 301 removed. Besides the components 301-304 and 311 described above, FIG. 8 shows four nuts 306. In this example, four nuts are shown, which can be self-clinching nuts FIG. 9 is a top view diagram illustrating an apparatus that can be used as part of apparatus 200 of FIG. 2 and apparatus 300 of FIG. 3 according to some embodiments of the present invention. As shown in FIG. 9, apparatus 900 includes a top plate 308. In this example, top plate 308 has four bolt holes 310 that are aligned to bolt holes 314 in guide structure 301 and nuts 306 in substrate 311 described above in connection with FIGS. 3-8. The bolt holes 314 can be used for fastening the DUT to the substrate using one or more bolts and the one or more nuts in the substrate. In some embodiments, top plate 308 can be made of a suitable material, for example, an insulator material with mechanical strength for bolting a DUT to the substrate. As an example, a blank PCB prototype-board can be used to form the top plate 308.

Figure 10:
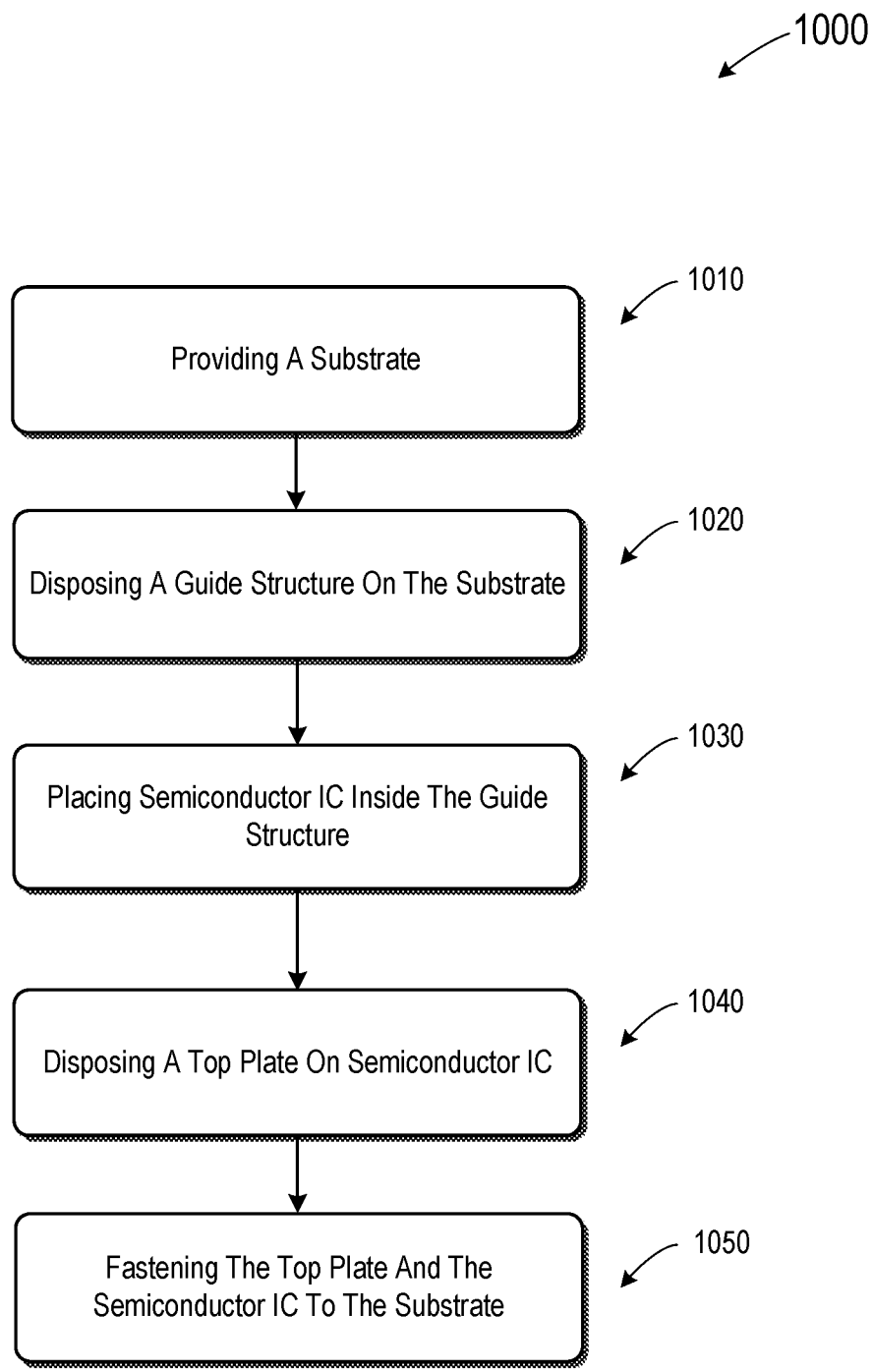
FIG. 10 is a simplified flowchart for a method for mounting a semiconductor IC to a substrate without a socket or solder according to some embodiments of the present invention.

FIG. 10 is a simplified flowchart for a method for mounting a semiconductor IC to a substrate without a socket or solder according to some embodiments of the present invention. As shown in FIG. 10, method 1000 starts with providing a substrate, at 1010. Method 1000 is described below with reference to the apparatus illustrated in FIGS. 2-9. The substrate can be a printed circuit board (PCB) 311, with one or more nuts 306 disposed in the PCB. The substrate can have multiple contact pads 302 and conductive lines 303 disposed on the PCB for coupling to a DUT, such as a semiconductor IC. A gold layer can be disposed on each of the multiple solder pads to reduce contact resistance.

In some embodiments, the method also includes connecting supporting components for a test board to the substrate before disposing the guide structure on the substrate. The supporting components can include one or more of connectors for connecting to the testing equipment, conductive lines connecting the connector to the contact pads, and circuit elements for conditioning signals to and from the testing equipment. For example, the supporting components can be connected to the substrate by hand-solder or infra-red (IR) reflow.

At 1020, a guide structure is disposed on the substrate. For example, guide structure 301 made of an insulating material is disposed on the PCB 311. A center opening 312 of the guide structure 301 exposes the multiple contact pads 303. The center opening 312 of the guide structure 301 is sized and has proper dimensions for placement of the semiconductor IC to make contact with the solder pads. Four bolt holes 310 are formed in the guide structure. Each of the four bolt holes 310 are aligned to a respective corresponding one of the four nuts 306 in the PCB 311.

At 1030, the method includes placing the semiconductor IC inside the guide structure such that the semiconductor IC makes contact with the contact pads.

At 1040 a top plate is disposed on the semiconductor IC. As shown in FIGS. 2 and 9, top plate 208 and 308 can be made of an insulator material and can have bolt holes matching the bolt holes in the guide structure and the nuts 206 or 306.

At 1050, the method includes fastening the top plate and the semiconductor IC to the substrate. As shown in FIG. 2, bolts 207 are inserted through bolt holes 210 in top plate 208 and bolt holes 205 in guide structure 201 and fastened to nuts 206 in substrate 211.

In some embodiments, the guide structure is disposed on the substrate using one or more bolts to fasten the guide structure to a first subset of nuts in the substrate. In some embodiments, the top plate and the semiconductor IC are fastened to the substrate using one or more bolts to fasten the top plate to a second subset of nuts in the substrate. For example, the guide structure can be disposed on the substrate using one or more bolts to fasten the guide structure to two diagonally opposite nuts in the substrate, and the top plate and the semiconductor IC are fastened to the substrate using one or more bolts to fasten the top plate to the other two diagonally opposite nuts in the substrate. At this point, the DUT, e.g., a semiconductor IC, is now ready for testing.

The method described above uses an improved test board for connecting the semiconductor IC to a test equipment. The method is useful in characterization testing in a research and development environment, in which frequent inserting and removing the DUT may be desirable. The method provides device connection. The method can also be useful in customer demonstration, where a defective semiconductor IC can be replaced easily or multiple semiconductor ICs demonstrated.

Although the above embodiments have been described using a selected group of components for a test board, it is understood that the examples and embodiments described herein are for illustrative purposes only. Various modifications or changes in light thereof will be suggested to persons skilled in the art and are to be included within the spirit and purview of this application and scope of the appended claims.

What is claimed is:

1. A test board for testing a semiconductor integrated circuit (IC), comprising:
    a printed circuit board (PCB);
    four self-clinching nuts disposed in the PCB;
    multiple solder pads disposed on the PCB for coupling to the semiconductor IC;
    a gold layer disposed on each of the multiple solder pads;
    a guide structure of an insulating material disposed on the PCB, a center opening of the guide structure exposing the multiple solder pads, the center opening of the guide structure being sized for placement of the semiconductor IC to make contact with the solder pads;
    four bolt holes in the guide structure; each of the four bolt holes aligned to a respective corresponding one of the four self-clinching nuts in the PCB;
    a top plate, having four bolt holes formed therein, the four bolt holes in the top plate matching the four bolt holes in the guide structure for fastening the semiconductor IC to the PCB using one or more bolts and the four self-clinching nuts.

2. The test board of claim 1, wherein the semiconductor IC is in a leadless package.

3. The test board of claim 1, wherein the top plate comprises a blank proto-type board.

4. The test board of claim 1, wherein the guide structure is a contiguous structure surrounding the center opening.

5. The test board of claim 1, wherein the guide structure comprises a glass-reinforced epoxy laminate.

6. The test board of claim 1, further comprising one or more of:
    connectors for connecting to a testing equipment;
    conductive lines connecting the connector to the solder pads; and
    circuit elements for conditioning signals to and from the testing equipment, the circuit elements including one or more of capacitors, inductors, resistors, diodes, and other semiconductor ICs.

* * * * *